United States Patent [19]
Tokami et al.

[11] Patent Number: 5,282,171
[45] Date of Patent: Jan. 25, 1994

[54] SEMICONDUCTOR MEMORY DEVICE HAVING A WORD DRIVER

[75] Inventors: Kenji Tokami; Takayuki Miyamoto, both of Hyogo, Japan

[73] Assignee: Mitsubishi Denki Kabushiki Kaisha, Tokyo, Japan

[21] Appl. No.: 963,358

[22] Filed: Oct. 20, 1992

[30] Foreign Application Priority Data

Mar. 27, 1992 [JP] Japan ................................ 4-071136

[51] Int. Cl.$^5$ ............................................. G11C 13/00
[52] U.S. Cl. ............................... 365/230.01; 365/203; 365/230.08; 365/226
[58] Field of Search ............... 365/203, 189.01, 230.01, 365/189.04, 230.03, 230.05, 230.08, 226

[56] References Cited

U.S. PATENT DOCUMENTS 4,953,127  8/1990  Nagahashi et al. ................. 365/226

FOREIGN PATENT DOCUMENTS 1-94591  4/1989  Japan .

Primary Examiner—Terrell W. Fears
Attorney, Agent, or Firm—Lowe, Price, LeBlanc & Becker

[57] ABSTRACT

Each driver circuit included in a word driver includes a transfer transistor and a driver transistor. A voltage of a predetermined voltage lower than a threshold voltage of the transfer transistor plus a power supply voltage is applied to the gate of the transfer transistor in an active period.

24 Claims, 18 Drawing Sheets

SEMICONDUCTOR MEMORY DEVICE HAVING A WORD DRIVER

BACKGROUND OF THE INVENTION

1. Field of the Invention

The present invention relates to semiconductor memory devices, and more particularly, to an improvement of a word driver for driving a word line.

2. Description of the Background Art

FIG. 17 is a block diagram showing a configuration of a conventional dynamic random access memory (hereinafter referred to as a DRAM). This DRAM is formed on a semiconductor chip CH.

A memory cell array 1 includes a plurality of word lines, a plurality bit lines crossing the plurality of word lines, and a plurality of memory cells connected to crossings of these word lines and bit lines. In FIG. 17, a word line WL, a set of bit line pairs BL, /BL and a memory cell MC connected to a crossing thereof. Each memory cell MC includes a capacitor for storing data and an N channel transistor. The N channel transistor is connected between the capacitor and a bit line, having its gate connected to a word line.

An RAS buffer 2 receives an external row address strobe signal /RAS to generate an internal row address strobe signal iRAS and a timing signal RAL. A CAS buffer 3 receives an external column address strobe signal /CAS to generate an internal column address strobe signal iCAS. A WE buffer 4 receives an external write enable signal /WE to generate an internal write enable signal iWE.

A row address buffer 5 receives an external address signal ADD to generate a row address signal RA in response to the timing signal RAL. A row decoder 6 selects any one of the plurality of word lines in the memory cell array 1 in response to the row address signal RA. A word driver 7 drives the word line WL selected by the row decoder 6 to a predetermined voltage. Data is read from a plurality of memory cells connected to selected word lines WL to respective corresponding bit line pairs. Data read to each bit line pair is amplified by a sense amplifier 12.

A column address buffer 10 receives the external address signal ADD to generate a column address signal CA in response to the internal column address strobe signal iCAS. A column decoder 11 selects any one of the plurality of bit line pairs in response to the column address signal CA. Accordingly, a selected bit line pair BL, /BL is connected to an input/output line pair IO, /IO.

In a write operation, an externally applied input data Din is provided to the input/output line pair IO, /IO through an input circuit 13. In a read operation, data on the input/output line pair IO, /IO is provided outside the chip through an output circuit 14 as output data Dout.

An RXT generating circuit 8 generates a timing signal RXT in response to the internal row address strobe signal iRAS and a portion of the row address signal RA, RAn, /RAn. An RX generating circuit 9 generates a driving signal RX having a higher voltage than a power supply voltage in response to the timing signal RXT. A control circuit 15 generates various control signals for controlling each portion in response to the internal column address strobe signal iCAS, the internal write enable signal iWE and the column address signal CA.

FIG. 18 is a diagram showing a detailed configuration of the row decoder 6 and the word driver 7.

The row decoder 6 includes a plurality of decoder circuits 60 corresponding to the plurality of word lines WL. The word driver 7 includes a plurality of driver circuits 70 corresponding to the plurality of word lines WL.

Each of the decoder circuits 60 includes an NAND gate G1. A 1-bit signal RAk of the row address signal RA or an inverted signal thereof /RAk is applied to each input terminal of the NAND gate G1, where k is an integer of 1 to n.

Each of the driver circuits 70 includes an inverter G2 and N channel transistors TR1, TR2, TR3. The transistors TR1 and TR2 are referred to as a transfer transistor and a driver transistor, respectively.

A node N1 is connected to the input terminal of the inverter G2 and the gate of the transistor TR3. The input terminal of inverter G2 is connected to a node N2. The transfer transistor TR1 is connected between the node N2 and a node N3. A power supply voltage Vcc is applied to the gate of the transfer transistor TR1.

The node N3 is connected to the gate of the driver transistor TR2. The driver transistor TR2 is connected between a node NX for receiving the driving signal RX and the word line WL. The transistor TR3 is connected between the corresponding word line WL and a ground terminal for receiving a ground potential Vss. The node N1 is connected to an output terminal of the corresponding decoder circuit 60.

Operations of a driver circuit shown in FIG. 18 will now be described with reference to a timing chart in FIG. 19. A period when the external row address strobe signal /RAS is at a logic high or "H" level is referred to as a stand-by period, while a period when the external row address strove signal /RAS is at a logic low or "L" level is referred to as an active period.

When the external row address strobe signal /RAS falls to "L", the internal row address strobe signal iRAS rises to "H" as well as the timing signal RAL rises to "H", thereby causing the external address signal ADD to be applied as the row address signal RA. As a result, the row decoder 6 decodes the row address signal RA to cause an output signal (a selecting signal) of a plurality of decoder circuits 60 to fall to "L".

Accordingly, the potential of the node N1 falls to the ground potential, causing the potential of the node N2 to rise to the power supply voltage Vcc. As a result, the potential of the node N3 becomes Vcc−Vth, where Vth is the threshold voltage of the transfer transistor TR1.

The driving signal RX rises to a high voltage Vcc+α in response to rise of the timing signal RXT. As a result, the potential of the node N3 is boosted to 2Vcc+α−Vth by a self-boosting operation of the driver transistor TR2 to cause the potential of the word line WL to rise to Vcc+α. Normally, α is set to a higher voltage than the threshold voltage of a transistor of the memory cell MC.

A power supply voltage Vcc is an internal power supply voltage down-converted by an external power supply voltage or an internal voltage down converting circuit.

A semiconductor memory device operating at a low power supply voltage is being developed in recent years with devices miniaturized. As will be described hereinafter, a low power supply voltage poses a problem of a slow rising rate of a voltage of the word line.

Assume that the power supply voltage Vcc is 5 V and that the threshold voltage Vth of the transfer transistor TR1 is 1.0 V. $\alpha$ is also assumed to be 1.0 V. In this case, the potential of the node N3 first rises from 0 V to 4 V. When the driving signal RX is pulled up from 0 V to 6 V, the potential of the node N3 rises from 4 V to 10 V.

Next, assume that the power supply voltage Vcc is 1.5 V and the threshold voltage Vth of the transfer transistor TR1 is 0.7 V. $\alpha$ is also assumed to be 1.0 V. In this case, the potential of the node N3 first rises from 0 V to 0.8 V. When the driving signal RX is pulled up from 0 V to 2.5 V, the potential of the node N3 rises from 0.8 V to 3.3 V.

As described above, when the power supply voltage Vcc is 5 V, the gate voltage of the driver transistor TR2 first attains 4 V, while when the power supply voltage Vcc is 1.5 V, the gate voltage of the driver transistor TR2 first attains 0.8 V. In other words, the lower power supply voltage brings about a smaller ratio of the voltage of the node N3 to the power supply voltage, because a ratio of the threshold voltage to the power supply voltage becomes larger.

Therefore, the conductance gm of the driver transistor TR2 becomes smaller, causing a self-boosting operation of the driver transistor TR2 to be slower. As a result, there is a problem of a longer rising time Td of the voltage of the word line WL.

SUMMARY OF THE INVENTION

One object of the present invention is to increase an operating speed of a semiconductor memory device having a word driver.

Another object of the present invention is to obtain a semiconductor memory device in which a rising rate of a voltage of a word line can be increased even though the power supply voltage is low.

Still another object of the present invention is to make it possible to carry out a layout efficiently, even when a higher degree of integration brings about a larger area of a decoder.

The semiconductor memory device according to one aspect of the present invention is provided with a word line, a selecting circuit for generating a selecting signal for selecting the word line, a driving circuit for driving the word line in response to the selecting signal, and a boosting circuit.

The driving circuit includes a transfer transistor and a driver transistor. The transfer transistor, having the gate for receiving the power supply voltage, transfers a voltage which responds to the selecting signal. The driver transistor, having the gate for receiving the voltage transferred by the transfer transistor, charges the word line to a predetermined voltage.

The boosting circuit, in an active period, boosts the voltage applied to the gate of the transfer transistor to a voltage of the predetermined voltage lower than the threshold voltage of the transfer transistor plus the power supply voltage.

In the active period, a voltage of the power supply voltage plus the predetermined voltage lower than the threshold voltage of the transfer transistor is applied to the gate of the transfer transistor. As a result, the gate voltage of the driver transistor becomes higher than a voltage of the power supply voltage minus the threshold voltage of the transfer transistor. Therefore, the conductance of the driver transistor becomes larger, causing a rising rate of the voltage of the word line to increase.

In this case, the gate voltage of the transfer transistor is lower than a voltage of the power supply voltage plus the threshold voltage of the transfer transistor, the transfer transistor is not turned on. Therefore, the gate voltage of the driver transistor is not pulled down through the transfer transistor.

The semiconductor memory device according to another aspect of the present invention is provided with a word line, a selecting circuit for generating a selecting signal for selecting the word line, a driving circuit for driving the word line in response to the selecting signal, and a voltage control circuit.

The driving circuit includes a transfer transistor and a driver transistor. The transfer transistor, having the gate for receiving the power supply voltage, transfers a voltage which responds to the selecting signal. The driver transistor, having the gate for receiving the voltage transferred by the transfer transistor, charges the word line to a predetermined voltage.

The voltage control circuit boosts a voltage applied to the gate of the transfer transistor to a voltage of the power supply voltage plus the threshold voltage of the transfer transistor in response to initiation of the active period, and pulls down the boosted voltage to the power supply voltage in response to drive of the word line.

In the active period, the voltage of the power supply voltage plus the threshold voltage of the transfer transistor is applied to the gate of the transfer transistor. As a result, the gate voltage of the driver transistor becomes equal to the power supply voltage. Therefore, the conductance of the driver transistor becomes larger, causing a rising rate of the voltage of the word line to increase.

In this case, since the gate voltage of the transfer transistor is equal to a voltage of the power supply voltage plus the threshold voltage of the transfer transistor, the transfer transistor is not turned on. Therefore, the gate voltage of the driver transistor is not pulled down through the transfer transistor.

Since the gate voltage of the transfer transistor is pulled down to the power supply voltage after drive of the word line, the transfer transistor is not turned on due to the influence of a noise and the like.

The semiconductor memory device according to still another aspect of the present invention is provided with a word line, a selecting circuit for generating a selecting signal for selecting the word line, a driving circuit for driving the word line in response to the selecting signal, and a high voltage generating circuit for generating a predetermined high voltage higher than the power supply voltage.

The driving circuit includes a high voltage supplying circuit, a transfer transistor and a driver transistor. The high voltage supplying circuit supplies a high voltage in response to the selecting signal. The transfer transistor, having the gate for receiving a high voltage from the high voltage supplying circuit, transfers the voltage from the high voltage supplying circuit. The driver transistor, having the gate for receiving the voltage transferred by the transfer transistor, charges the word line to a predetermined voltage.

The high voltage supplying circuit may include a first node for receiving a voltage responding to the selecting signal, a second node connected to the transfer transistor, a first charging circuit for charging the first node to a high voltage in response to the voltage of the second node at the time of non-selection, and a second charging circuit for charging the second node to a high voltage in response to the voltage of the first node at the time of selection.

The driving circuit may further include a transfer transistor. The transfer transistor, having the gate for receiving the power supply voltage, is connected between an output of the selecting circuit and the first node.

A high voltage is applied to the gate of the transfer transistor by the high voltage generating circuit. The high voltage supplied by the high voltage supplying circuit is transferred to the gate of the driver transistor through the transfer gate transistor in response to the selecting signal. As a result, the gate voltage of the driver transistor is brought to a voltage of the high voltage minus the threshold voltage of the transfer transistor. Therefore, the conductance of the driver transistor becomes larger, causing a rising rate of the voltage of the word line to increase.

The semiconductor memory device according to a further aspect of the present invention is provided with a plurality of word lines, a plurality of driving circuits provided corresponding to the plurality of word lines, a selecting circuit provided in common to the plurality of driving circuits, a switching circuit connected between the selecting circuit and the plurality of driving circuits, and a voltage supplying circuit. The selecting circuit generates the selecting signal. The switching circuit selectively transfers the selecting signal from the selecting circuit to any of the plurality of driving circuits. Each of the plurality of driving circuits includes a transfer transistor, a driver transistor and a voltage supplying circuit. The transfer transistor transfers a voltage corresponding to the selecting signal. The driver transistor, having the gate for receiving a voltage transferred by the transfer transistor, charges a corresponding word line to a predetermined voltage. The voltage supplying circuit supplies a predetermined voltage higher than the power supply voltage to the gate of the transfer transistor.

The semiconductor memory device may further include a high voltage generating circuit for generating a predetermined high voltage higher than the power supply voltage. The switching circuit may include a plurality of switch transistors respectively connected between the selecting circuit and the plurality of driving circuits.

The voltage supplying circuit included in each of the driving circuits may include a first node connected to a corresponding switch transistor, a second node connected to the transfer transistor, a first charging circuit for charging the first node to a high voltage in response to a voltage of the second node at the time of non-selection, a second charging circuit for charging the second node to a high voltage in response to a voltage of the first node at the time of selection, and a discharging circuit for discharging the second node in response to a predetermined reset signal at the time of non-selection.

A predetermined voltage higher than the power supply voltage is supplied to the gate of the transfer transistor of each driving circuit. As a result, the gate voltage of the driver transistor is brought to a voltage of a predetermined voltage higher than the power supply voltage minus the threshold voltage of the transfer transistor. Therefore, the conductance of the driver transistor becomes larger, causing a rising rate of a voltage of the word line to increase.

A selecting circuit is provided in common to the plurality of driving circuits. Even though a higher degree of integration brings about a larger area occupied by the selecting circuit, it is possible to carry out the entire layout efficiently.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (1) A first embodiment (FIGS. 1 to 5)

Figure 1:
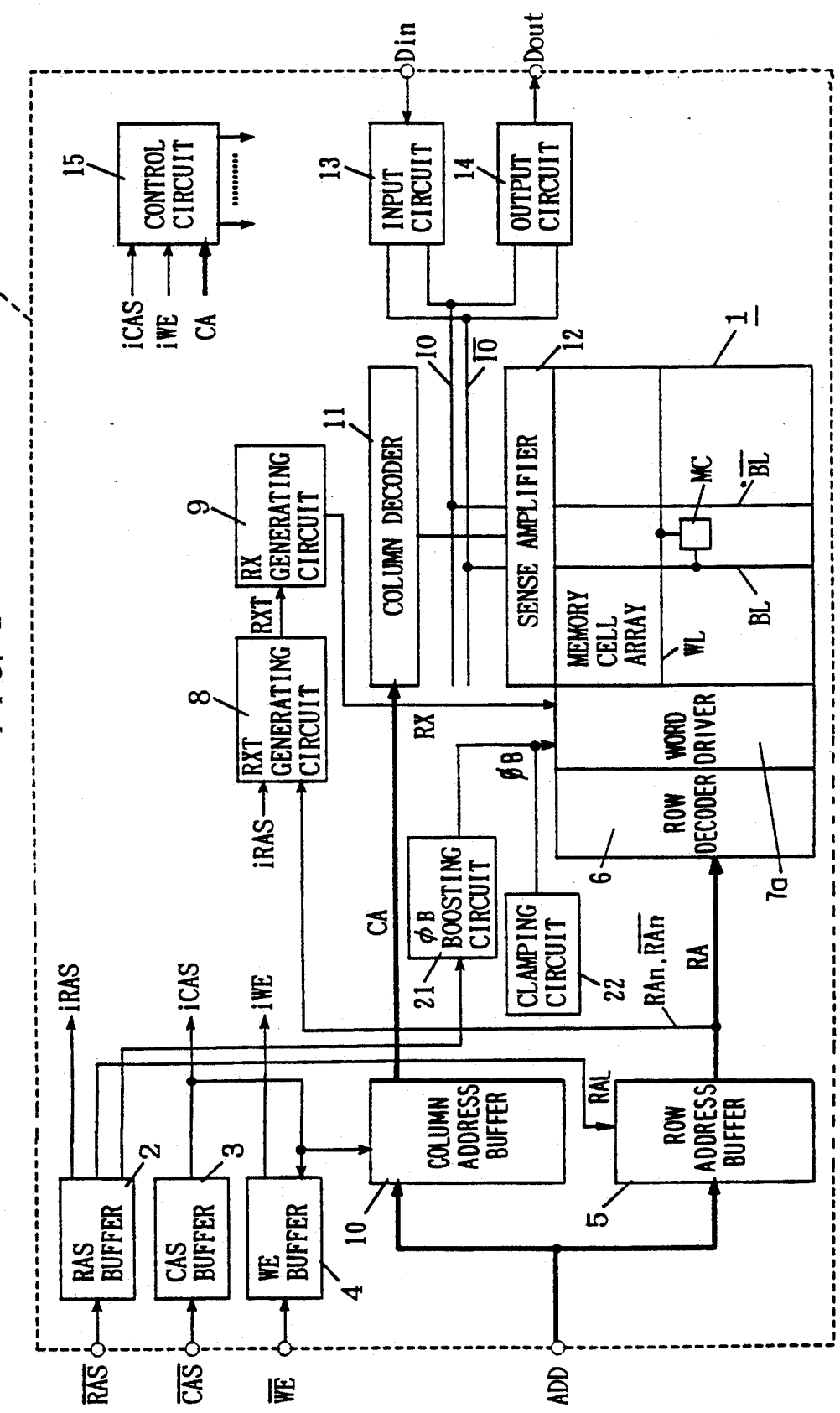
FIG. 1 is a block diagram showing the entire configuration of a DRAM according to a first embodiment.
Figure 17:
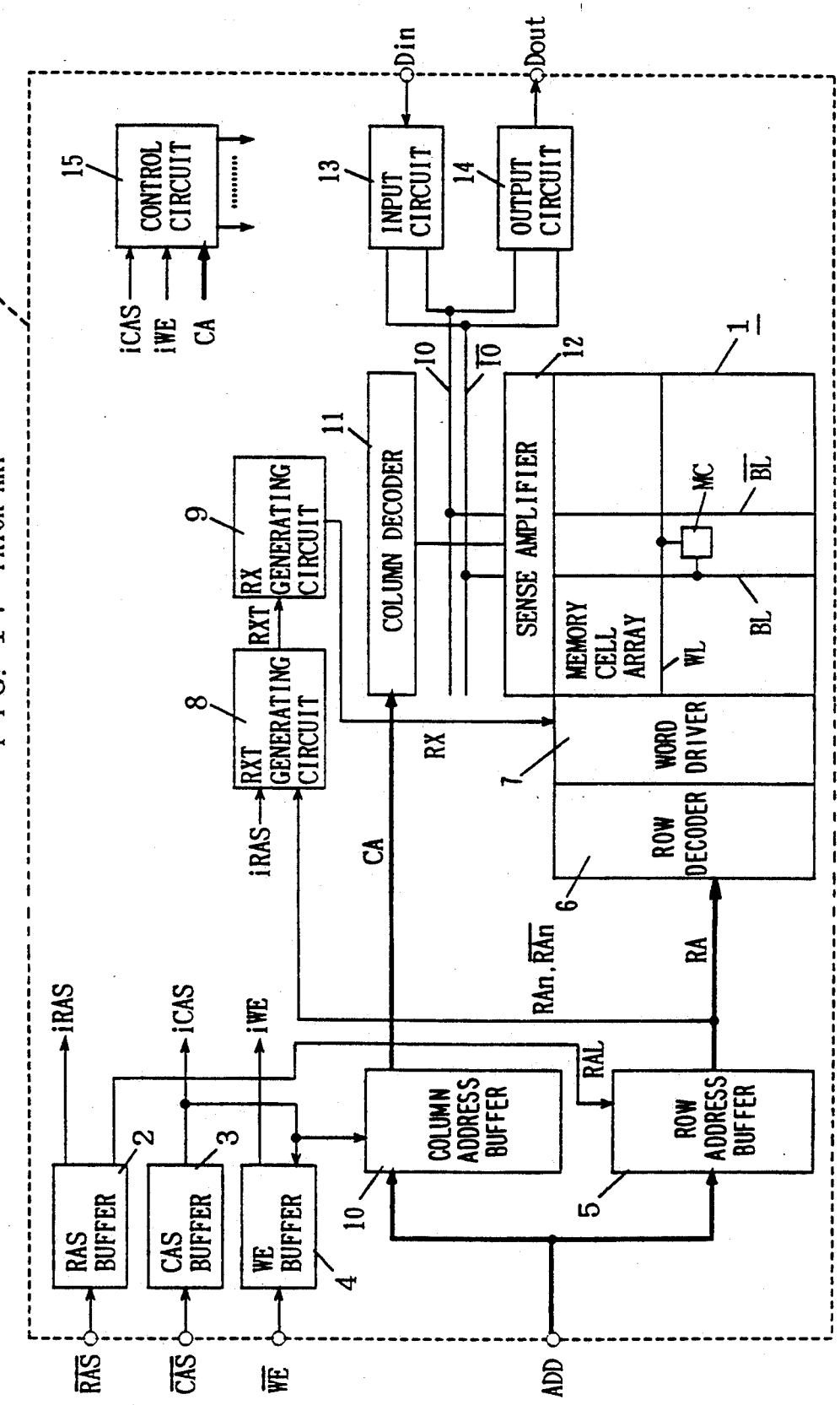
FIG. 17 is a block diagram showing the entire configuration of a conventional DRAM.

FIG. 1 is a block diagram showing the entire configuration of a DRAM according to a first embodiment. The DRAM of FIG. 1 is different from that of FIG. 17 in that a $\phi_B$ boosting circuit 21 and a clamping circuit 22 are provided, and that a word driver 7a for receiving a high voltage signal $\phi_B$ is provided in place of a word driver 7 for receiving a power supply voltage Vcc.

Figure 2:
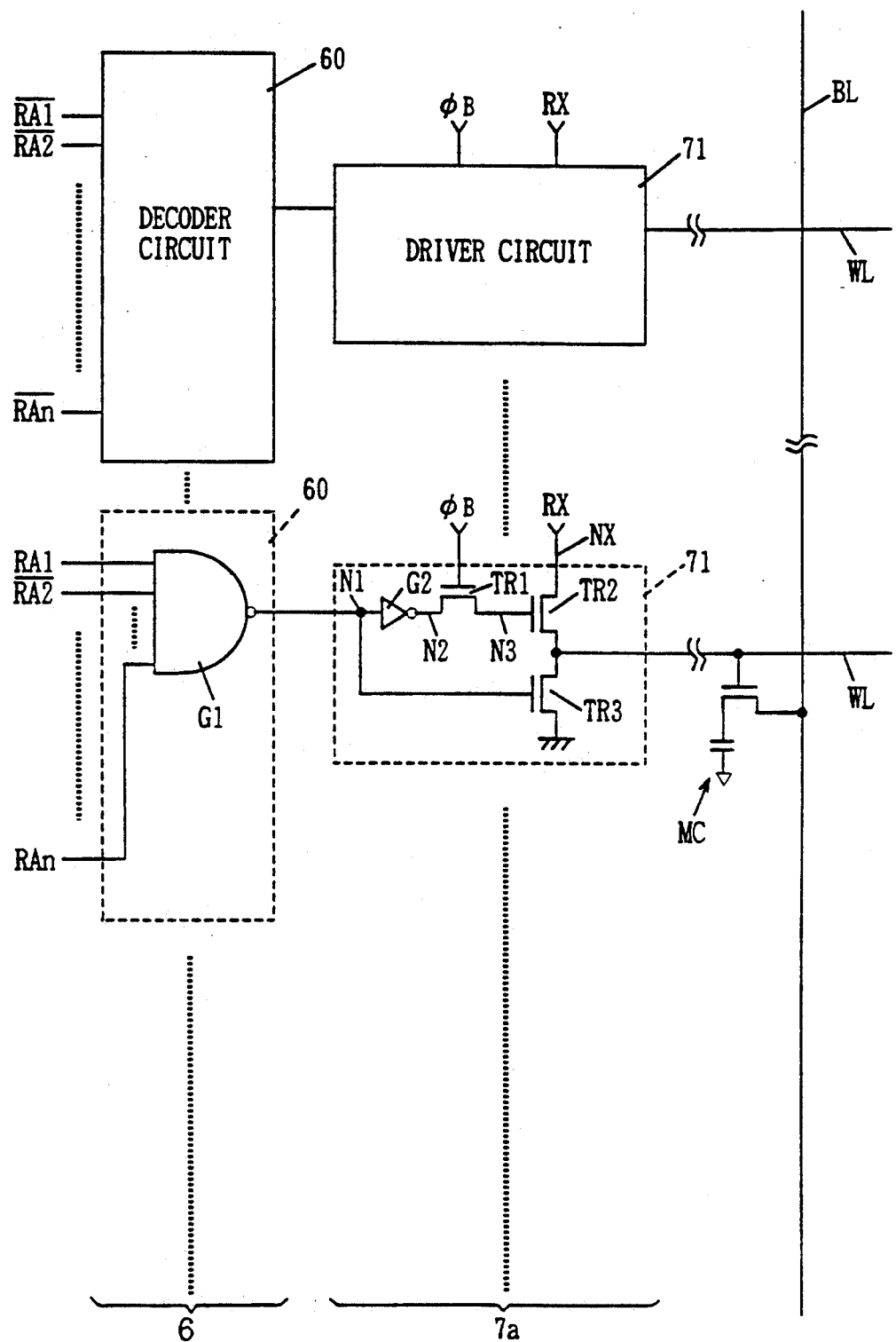
FIG. 2 is a schematic diagram of a circuit showing a configuration of a row decoder and a word driver included in the DRAM of FIG. 1.
Figure 18:
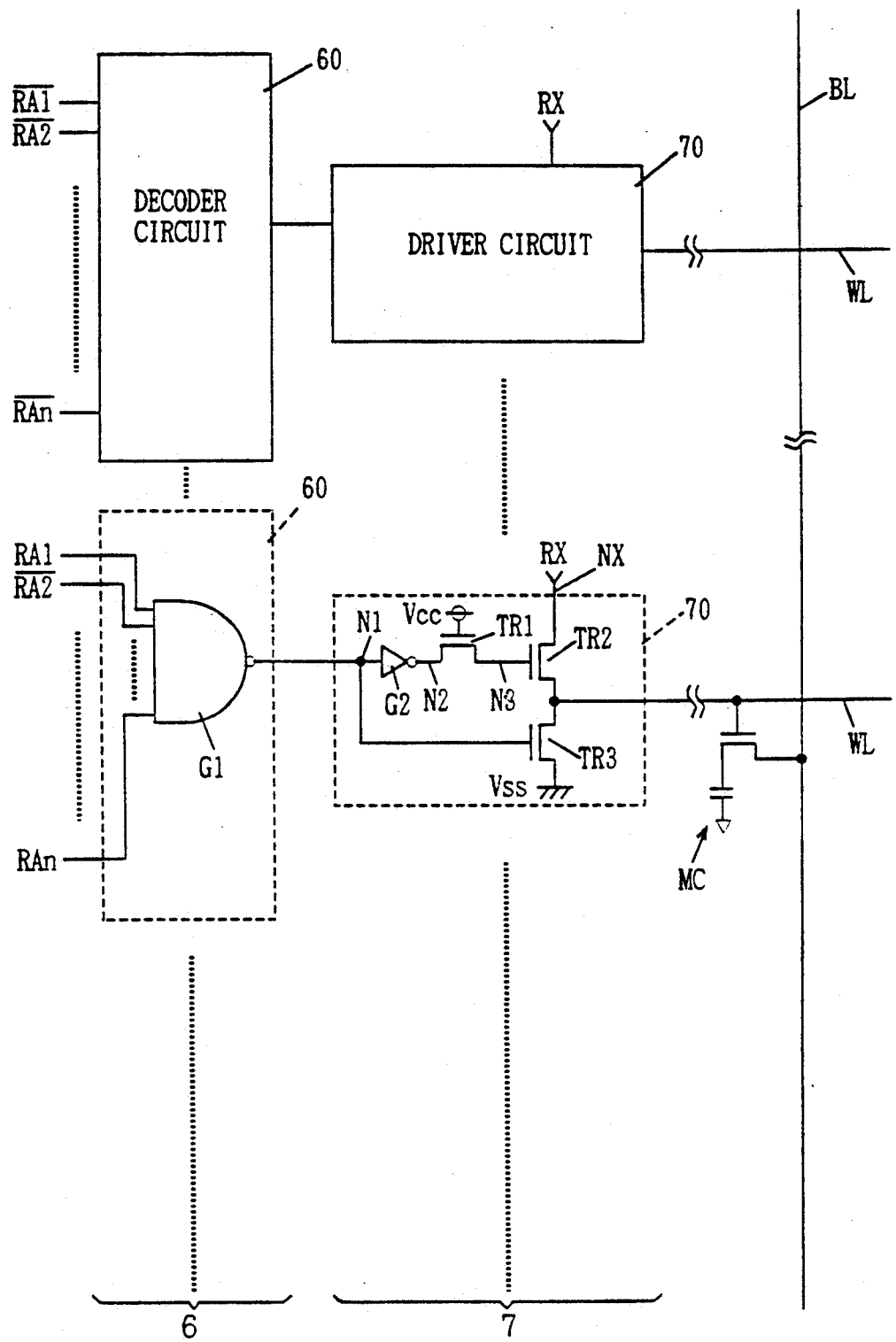
FIG. 18 is a schematic diagram of a circuit showing a configuration of a row decoder and a word driver included in the DRAM of FIG. 17.
Figure 19:
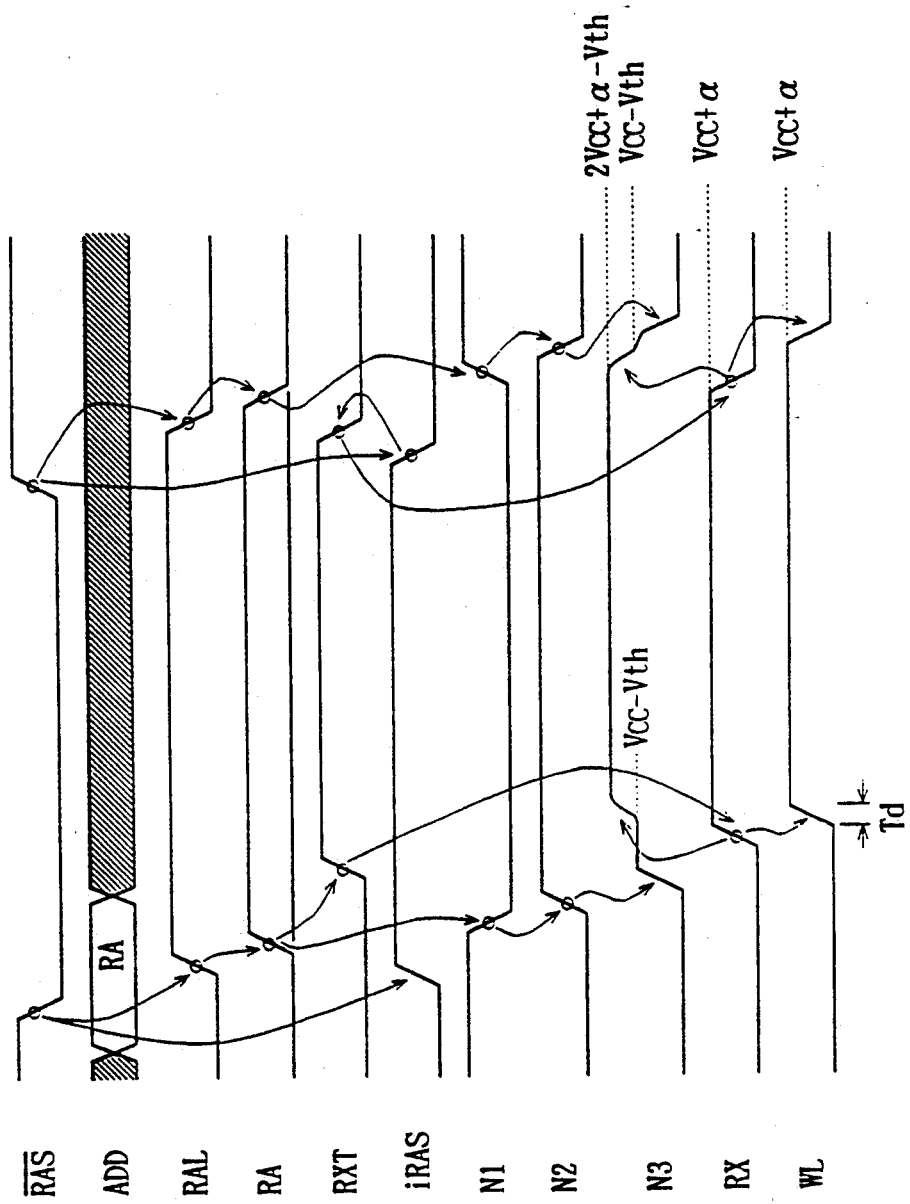
FIG. 19 is a timing chart for explaining operations of a driver circuit shown in FIG. 18.

FIG. 2 shows a detailed configuration of a row decoder 6 and the word driver 7a. The configuration of the row decoder 6 is similar to that of the row decoder 6 shown in FIG. 18.

The word driver 7a includes a plurality of driver circuits 71 corresponding to a plurality of word lines WL. Each driver circuit 71, as well as a driver circuit 70 shown in FIG. 18, includes an inverter G2 and N channel transistors TR1, TR2, TR3. Transistors TR1 and TR2 are referred to as a transfer transistor and a driver transistor, respectively. A high voltage signal $\phi_B$ from the $\phi_B$ boosting circuit 21 shown in FIG. 1 is applied to the gate of the transfer transistor TR1.

Figure 3:
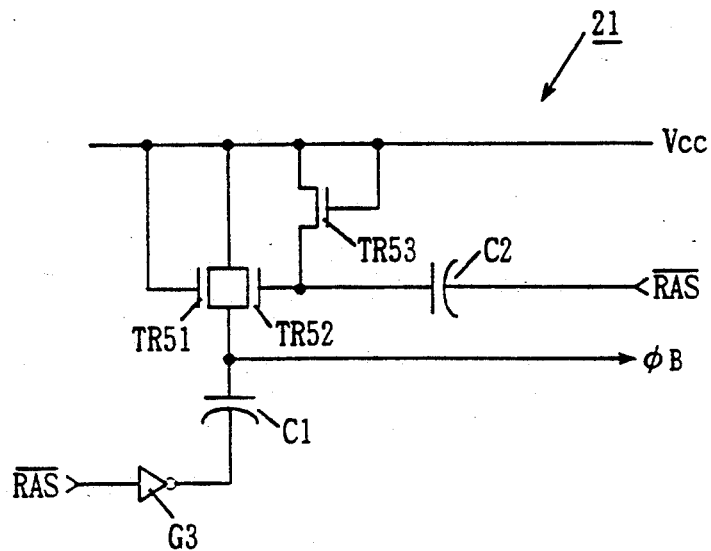
FIG. 3 is a schematic diagram showing a configuration of a $\phi_B$ boosting circuit included in the DRAM of FIG. 1.

FIG. 3 shows a detailed configuration of the $\phi_B$ an inverter G3, N channel transistors TR51, TR52, TR53 and capacitors C1, C2.

When the external row address strobe signal /RAS rises from "L" to "H", the gate voltage of the transistor TR52 is boosted to a voltage higher than the power supply voltage Vcc by coupling of the capacitor C2. As a result, the transistor TR52 is brought into an on-state. Therefore, the high voltage signal $\phi_B$ attains the power supply voltage Vcc.

When the external row address strobe signal /RAS falls to "L", the gate voltage of the transistor TR52 attains "L", thereby causing the transistor TR52 to be turned off. The output of the inverter G3 attains "H", thereby boosting the high voltage signal $\phi_B$ to a voltage higher than the power supply voltage Vcc by coupling of the capacitor C1.

Figure 4:
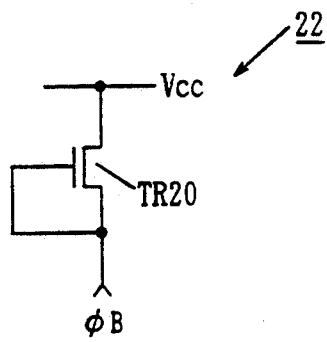
FIG. 4 is a schematic diagram showing a configuration of a clamping circuit included in the DRAM of FIG. 1.

FIG. 4 shows a configuration of the clamping circuit 22. The clamping circuit 22 includes a diode-connected N channel transistor TR20, which has the threshold voltage Vth'. The threshold voltage Vth' is set to be slightly smaller than the threshold voltage Vth of the transfer transistor TR1 shown in FIG. 2.

When the high voltage signal $\phi_B$ becomes higher than Vcc+Vth', the transistor TR20 is turned on. As a result, the high voltage signal $\phi_B$ is pulled down to Vcc+Vth'.

Thus, the clamping circuit 22 operates to hold the high voltage signal $\phi_B$ at Vcc+Vth'.

Figure 5:
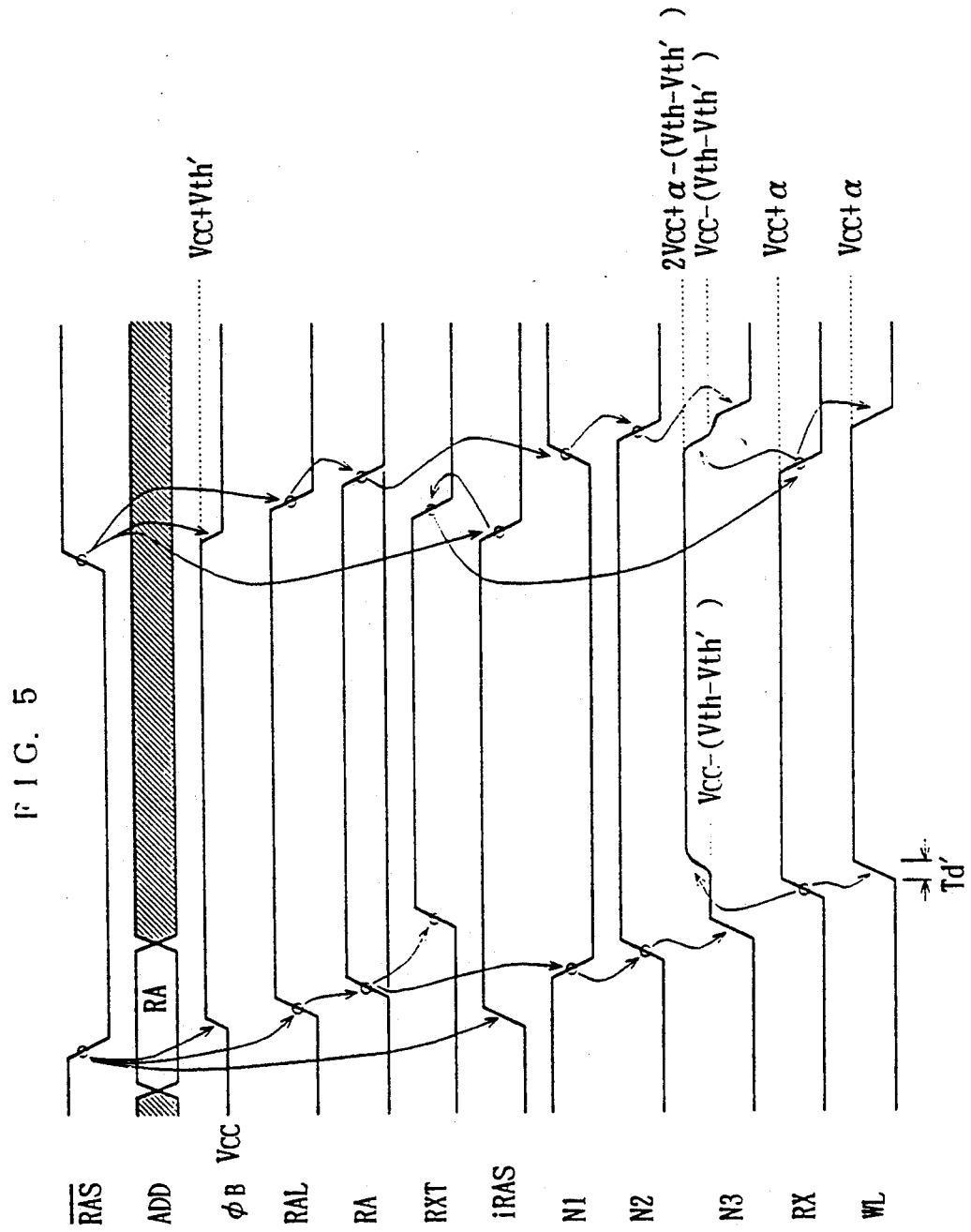
FIG. 5 is a timing chart for explaining operations of a driver circuit shown in FIG. 2.

Operations of the driver circuit 71 of FIG. 2 will now be described with reference to a timing chart of FIG. 5.

When the external row address strobe signal /RAS falls to "L", an active period is initiated. The high voltage signal $\phi_B$ increases from the power supply voltage Vcc to Vcc+Vth' in response to fall of the external row address strobe signal /RAS. When the potential of the node N1 falls to the ground potential, the potential of the node N2 rises to the power supply voltage Vcc. Since the gate voltage of the transfer transistor TR1 attains Vcc+Vth', the potential of the node N3 is brought to Vcc−(Vth−Vth').

Then, when the driving signal RX rises from the ground potential to Vcc+α, the potential of the node N3 increases to 2 Vcc+α−(Vth−Vth') by a self-boosting operation of the driver transistor TR2. As a result, the potential of the word line WL rises to Vcc+α.

When the external row address strobe signal /RAS rises to "H", the active period is terminated and a standby period is initiated. The high voltage signal $\phi_B$ drops from Vcc+Vth' to Vcc in response to rise of the external row address strobe signal /RAS.

In response to rise of the external row address strobe signal /RAS, the internal row address strobe signal iRAS falls, and the timing signal RXT also falls, thereby pulling down the driving signal RX from Vcc+α to the ground potential. As a result, the potential of the node N3 drops to Vcc−(Vth−Vth'), thereby pulling down the potential of the word line WL to the ground potential.

In response to fall of the external row address strobe signal /RAS, the timing signal RAL falls, the potential of the node N1 rises to the power supply voltage Vcc and the potential of node N2 falls to the ground potential. As a result, the potential of the node N3 drops to the ground potential.

In the above-described embodiment, assume that, for example, the power supply voltage Vcc is 5 V, the threshold voltage Vth of the transfer transistor TR1 is 1.0 V, and the threshold voltage Vth' of the transfer transistor TR20 of the clamping circuit 22 is 0.9 V. α is also assumed to be 1.0 V. In this case, the gate voltage of the transfer transistor TR1 attains 5.9 V in the active period. The potential of the node N3 first rises from 0 V to 4.9 V, and then rises to 10.9 V.

In the above-described embodiment, since the potential of the node N3 becomes high in the active period, the conductance gm of the driver transistor TR2 becomes larger, resulting in the faster self-boosting operation of the driver transistor TR2. Accordingly, the rising time Td' of the voltage of the word line WL becomes short.

In this embodiment, the high voltage signal $\phi_B$ is boosted to Vcc+Vth' slightly lower than Vcc+Vth. The case when the high voltage signal $\phi_B$ is boosted to Vcc+Vth will now be considered.

In this case, if the period when the driving signal RX is at a high level lasts long, there is a possibility that the level of the high voltage signal $\phi_B$ becomes slightly higher than Vcc+Vth because of the influence of a noise and the like, causing the transistor TR1 to be turned on. As a result, the potential of the node N3 boosted by the self-boosting operation is pulled down through the transfer transistor TR1.

To eliminate such a problem, the threshold voltage Vth' of the transistor TR20 of the above-described clamping circuit 22 is set to be slightly smaller than the threshold voltage Vth of the transfer transistor TR1.

In order to set the threshold voltage of the transistor TR20 to be slightly smaller, for example, the gate length of the transistor TR20 is made shorter than that of the transfer transistor TR1, or the channel dose of the transistor TR29 is made lower than that of the transfer transistor TR1.

Figure 6:
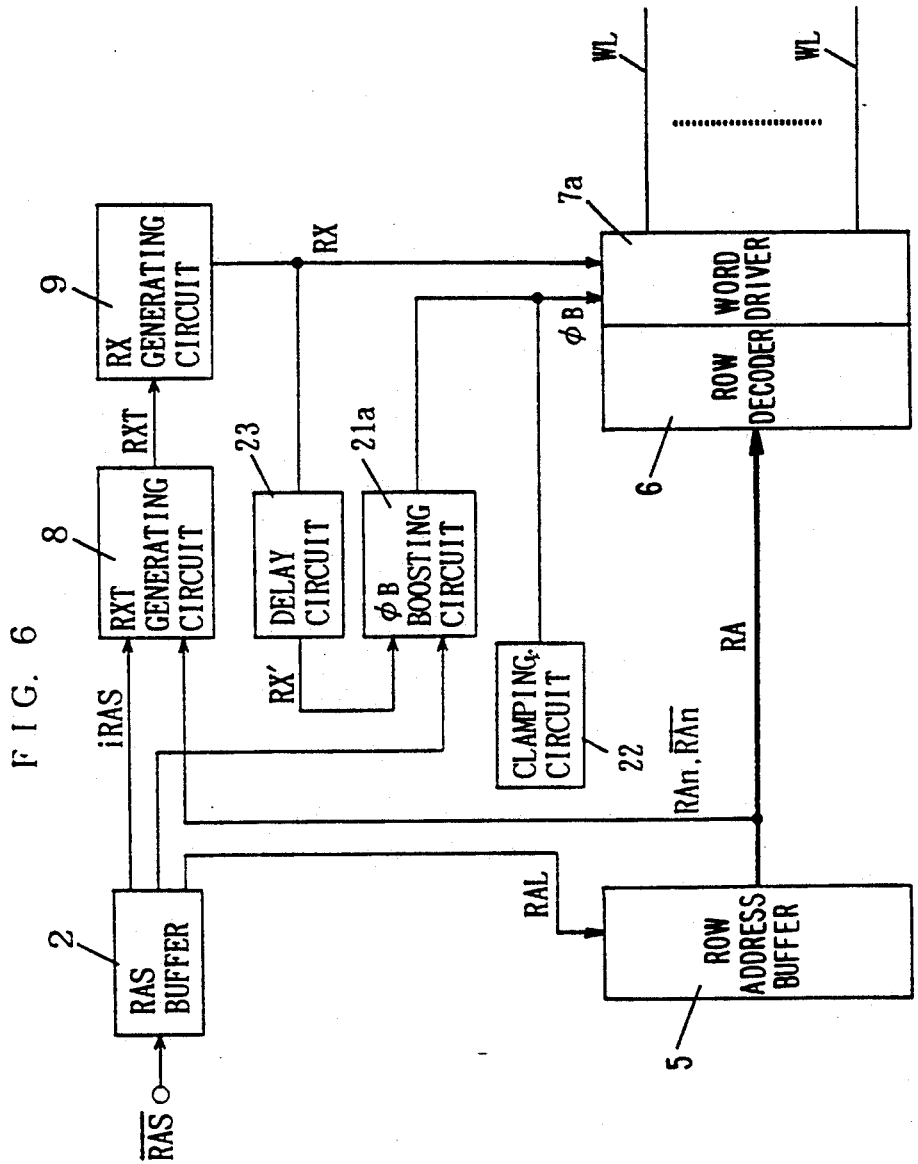
FIG. 6 is a block diagram showing a configuration of a main portion of the DRAM according to a second embodiment.
Figure 7:
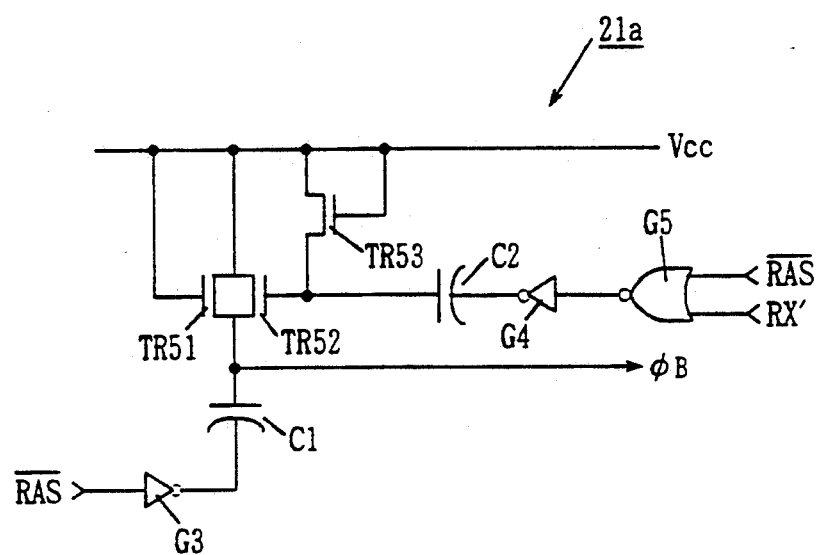
FIG. 7 is a schematic diagram showing a configuration of a $\phi_B$ boosting circuit included in the DRAM of FIG. 6.
Figure 8:
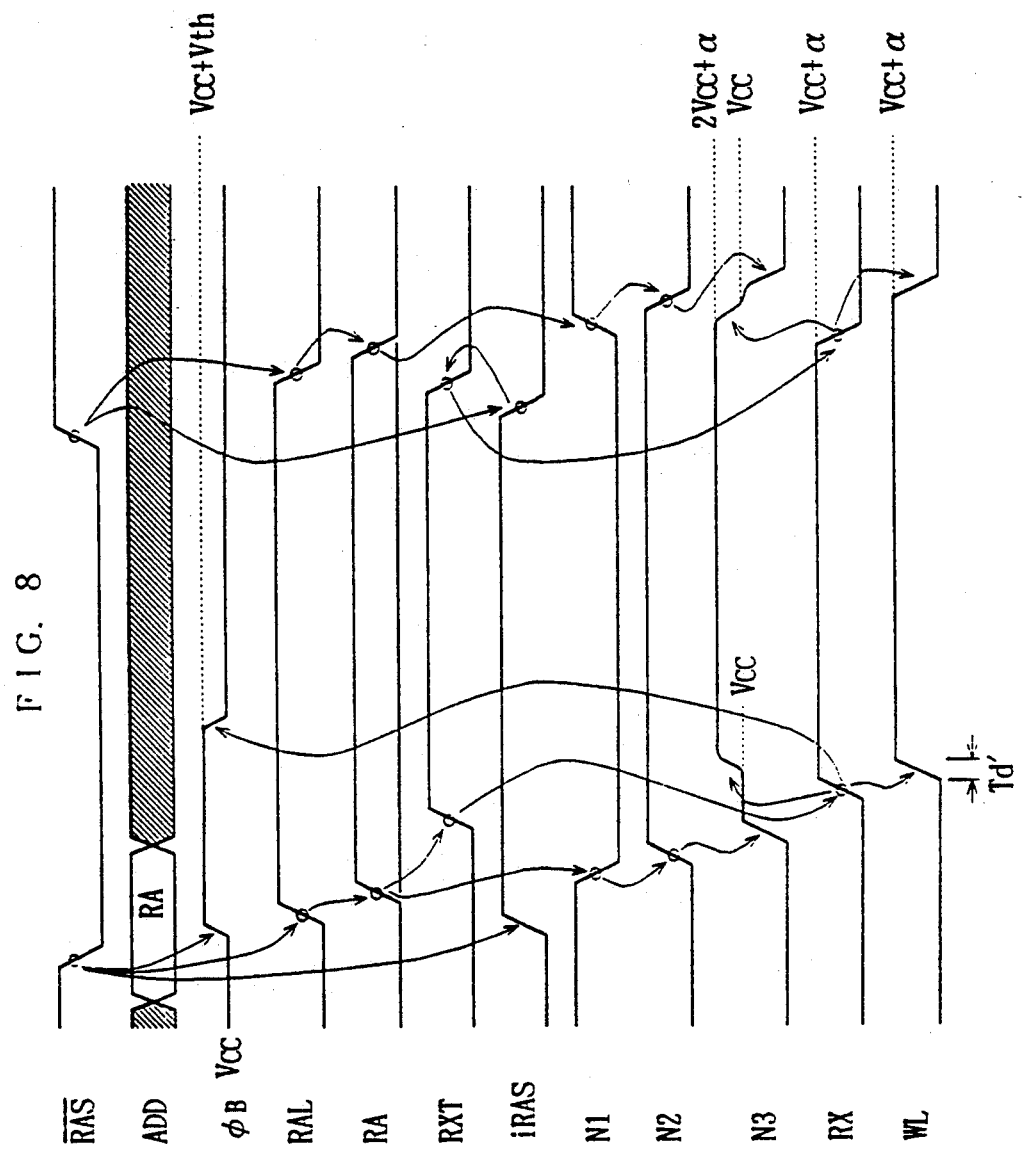
FIG. 8 is a timing chart for explaining operations of the embodiment of FIG. 6.

(2) A second embodiment (FIGS. 6 to 8)

FIG. 6 is a block diagram showing a configuration of a main portion of a DRAM according to a second embodiment. The DRAM of FIG. 6 is different from that of FIG. 1 in that a delay circuit 23 is further provided, and that a $\phi_B$ boosting circuit 21a is provided in place of the $\phi_B$ boosting circuit 21.

The delay circuit 23 receives the driving signal RX provided from the RX generating circuit 9 to supply a delay signal RX, as an output. The $\phi_B$ boosting circuit 21a generates the high voltage signal $\phi_B$ in response to the external row address strobe signal /RAS and the delay signal RX, from the delay circuit 23. The clamping circuit 22 clamps the high voltage signal $\phi_B$ to a predetermined voltage.

FIG. 7 shows a detailed configuration of the $\phi_B$ boosting circuit 21a. The $\phi_B$ boosting circuit 21a of FIG. 7 is different from the $\phi_B$ boosting circuit 21 shown in FIG. 3 in that an inverter G4 and an NOR gate G5 are further provided. The external row address strobe signal /RAS and the delay signal RX, are provided to one input terminal and the other input terminal of the NOR gate G5, respectively. An output terminal of the NOR gate G5 is connected to the capacitor C2 through the inverter G4.

In the $\phi_B$ boosting circuit 21a, when the external row address strobe signal /RAS falls to "L", the high voltage signal $\phi_B$ is boosted to a voltage higher than the power supply voltage Vcc by coupling of the capacitor C1. When the delay signal RX, rises to "H", the gate voltage of a transistor TR52 is boosted to a voltage higher than the power supply voltage Vcc by coupling of the capacitor C2, thereby bringing the transistor TR52 to an on-state. As a result, the high voltage signal $\phi_B$ drops to the power supply voltage Vcc.

The threshold voltage of the transistor TR20 (cf. FIG. 4) included in the clamping circuit 22 is set to be equal to the threshold voltage Vth of the transfer transistor TR1 (cf. FIG. 2).

Operations of the embodiment of FIG. 6 will now be described with reference to a timing chart of FIG. 8. When the external row address strobe signal /RAS falls to "L", the active period is initiated. The high voltage signal $\phi_B$ increases from the power supply voltage Vcc to Vcc+Vth in response to fall of the external row address strobe signal /RAS. When the potential of the node N1 shown in FIG. 2 falls to the ground potential, the potential of the node N2 rises to the power supply voltage Vcc. Since the gate voltage of the transfer transistor TR1 attains Vcc+Vth, the potential of the node N3 rises from the ground potential to the power supply voltage Vcc.

When the driving signal RX rises from the ground potential to Vcc+$\alpha$, the potential of the node N3 is pulled up to 2 Vcc+$\alpha$ by a self-boosting operation of the driver transistor TR2. As a result, the potential of the word line WL rises from the ground potential to Vcc+$\alpha$.

The high voltage signal $\phi_B$ drops to the power supply voltage Vcc a certain time after rise of the driving signal RX.

Also in this embodiment, the potential of the node N3 becomes high in the active period. The conductance gm of the driver transistor TR2 therefore becomes larger, increasing a rate of the self-boosting operation. As a result, the rising time Td' of the voltage of the word line WL is shortened.

After driving the word line WL, since the high voltage signal $\phi_B$ is down-converted from Vcc+Vth to the power supply voltage Vcc, the transfer transistor TR1 is prevented from being slightly turned on because of the influence of a noise and the like.

Figure 9:
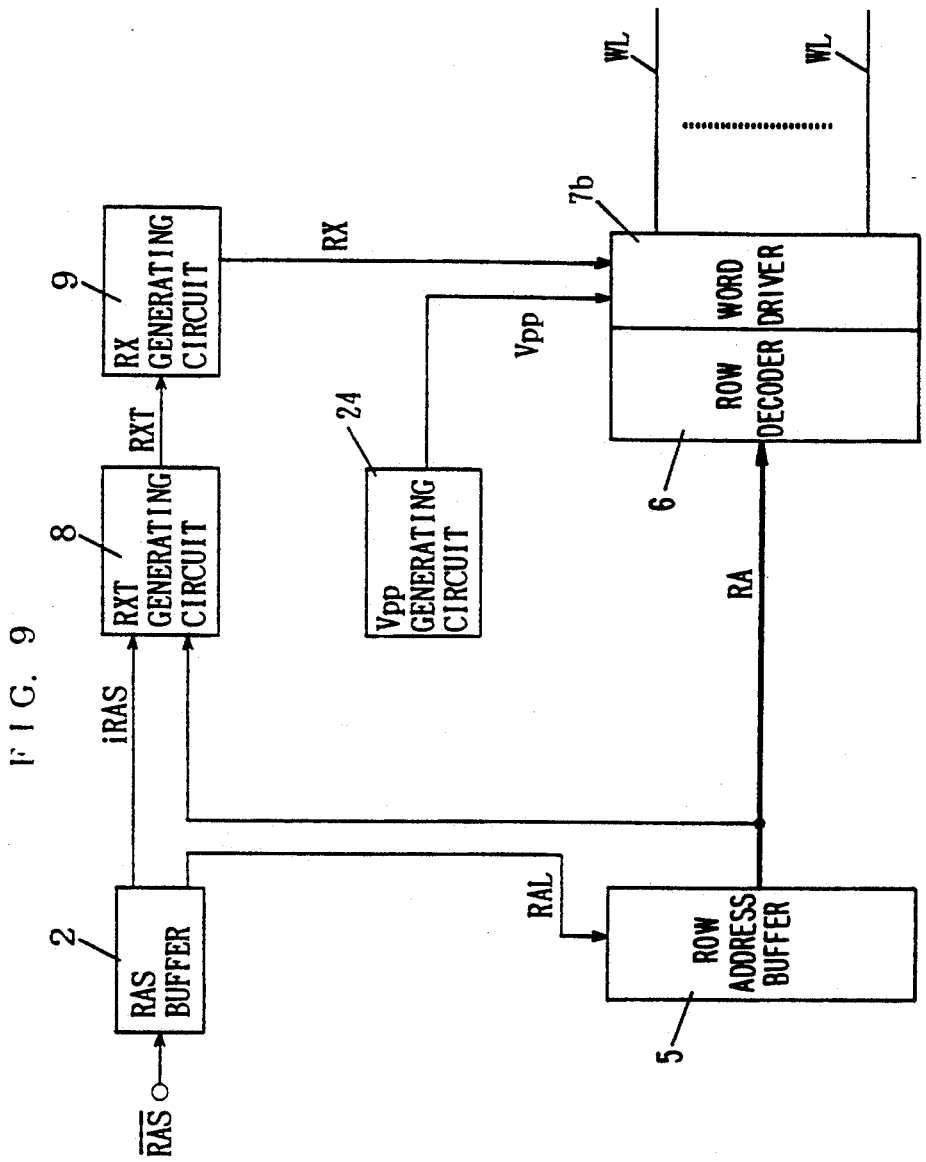
FIG. 9 is a block diagram showing a configuration of a main portion of a DRAM according to a third embodiment.
Figure 10:
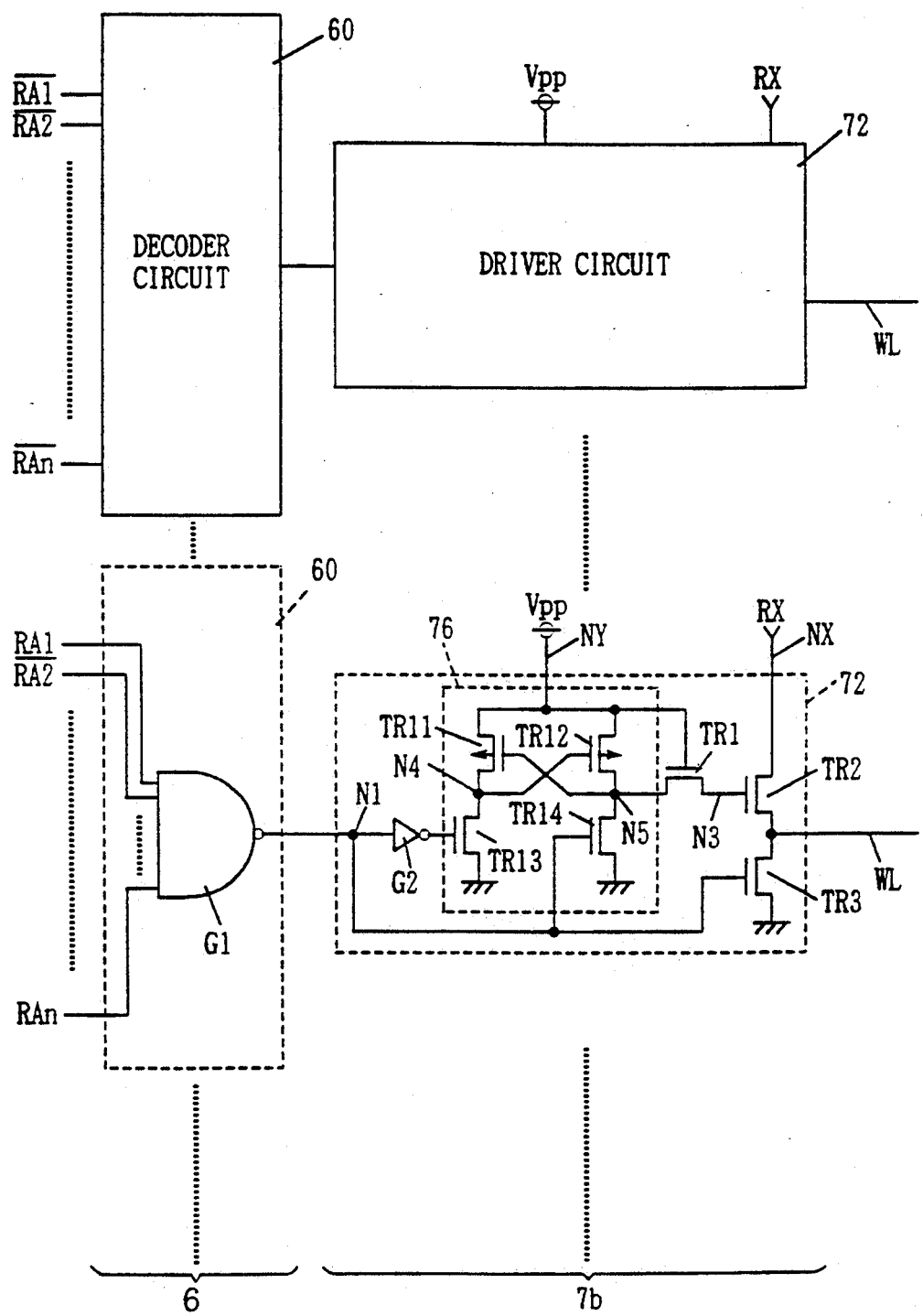
FIG. 10 is a schematic diagram of a circuit showing a configuration of a row decoder and a word driver included in the DRAM of FIG. 9.
Figure 11:
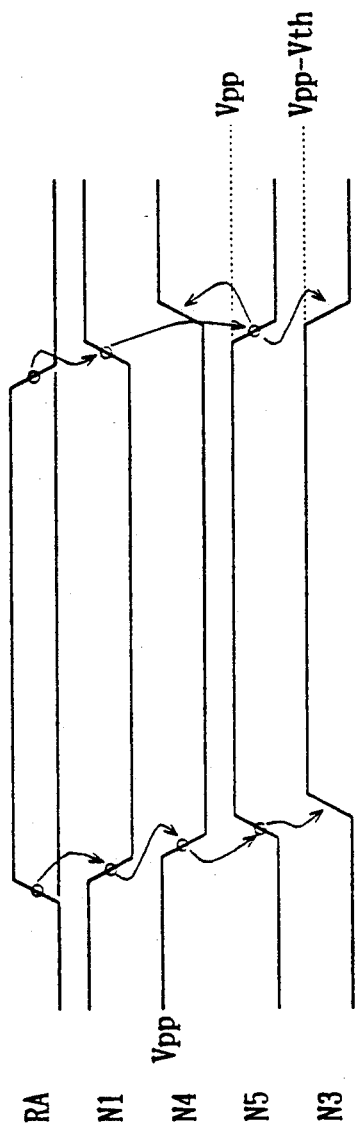
FIG. 11 is a timing chart for explaining operations of a driver circuit shown in FIG. 10.

(3) A third embodiment (FIGS. 9 to 11)

FIG. 9 is a block diagram showing a configuration of a main portion of a DRAM according to a third embodiment. The DRAM of FIG. 9 is different from that of FIG. 1 in that a Vpp generating circuit 24 is provided in place of the $\phi_B$ boosting circuit 21 and the clamping circuit 22, and that a word driver 7b is provided in place of the word driver 7a.

The Vpp generating circuit 24 generates and applies to the word driver 7b a predetermined high voltage Vpp higher than the power supply voltage Vcc. The configuration of the other portions is similar to that shown in FIG. 1.

FIG. 10 shows a detailed configuration of the row decoder 6 and the word driver 7b. The configuration of the row decoder 6 is similar to that of the row decoder 6 shown in FIG. 2. The word driver 7b includes a plurality of driver circuits 72 corresponding to the plurality of word lines WL.

Each driver circuit 72, as well as the driver circuit 71 of FIG. 2, includes an inverter G2 and N channel transistors TR1, TR2, TR3. The driver circuit 72 further includes a high voltage supplying circuit 76.

The high voltage supplying circuit 76 includes P channel transistors TR11, TR12 and N channel transistors TR13 and TR14. The transistor TR11, connected between a node NY and a node N4, has the gate connected to a node N5. The transistor TR12, connected between the node NY and the node N5, has the gate connected to the node N4. The transistor TR13, connected between the node N4 and a ground terminal, has the gate connected to the node N2. The transistor TR14, connected between the node N5 and the ground terminal, has the gate connected to the node N1.

The high voltage Vpp is applied to the node NY from the Vpp generating circuit 24 shown in FIG. 9. The node N5 is connected to the node N3 through the transfer transistor TR1. The high voltage Vpp is set to be, for example, Vcc+2Vth, where Vth indicates the threshold voltage of the transfer transistor TR1.

Operations of the driver circuit 72 of FIG. 10 will now be described with reference to a timing chart of FIG. 11.

When the potential of the node N1 is the power supply voltage Vcc, the transistor TR14 is in an on-state, whereby the potential of the node N5 becomes the ground potential. The transistor TR11 is also in an on-state, whereby the node N4 is charged to the high voltage Vpp. At that time, the potential of the node N3 becomes the ground potential.

When the potential of the node N1 becomes the ground potential, the potential of the node N2 becomes the power supply voltage Vcc, whereby the transistor TR13 is turned on. As a result, the potential of the node N4 becomes the ground potential, causing the transistor TR12 to be turned on, whereby the node N5 is charged to the high voltage Vpp Therefore, the potential of the node N3 becomes Vpp−Vth, where Vth is the threshold voltage of the transfer transistor TR1.

When the potential of the node N1 rises to the power supply voltage Vcc, the transistor TR14 is turned on, whereby the potential of the node N5 becomes the ground potential. As a result, the transistor TR11 is turned on, causing the node N4 to be charged to the high voltage Vpp, whereby the transistor TR12 is turned off and the potential of node N3 becomes the ground potential.

Assume that, for example, the high voltage Vpp is 7.0 V, and that the threshold voltage Vth of the transfer transistor TR1 is 1.0 V. In this case, the potential of the node N3 rises from 0 V to 6 V in response to fall of the potential of the node N1.

As described above, in the selected driver circuit 72, since the node N3 is charged up to Vpp−Vth, the conductance gm of the driver transistor TR2 becomes larger. As a result, a rate of the self-boosting operation of the driver transistor TR2 increases to cause a rising rate of the voltage of the word line WL to be shortened.

Figure 12:
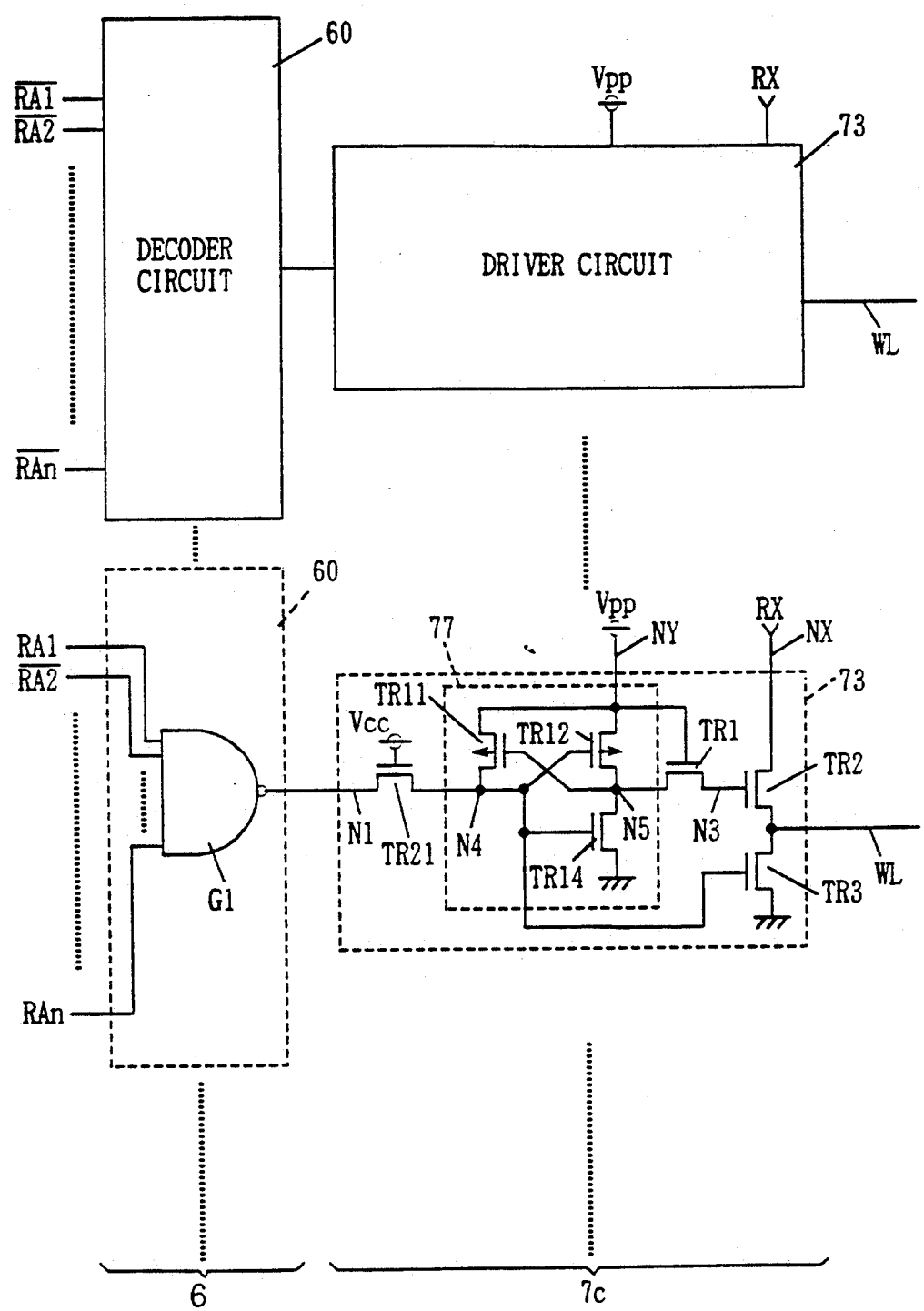
FIG. 12 is a schematic diagram of a circuit showing a configuration of a row decoder and a word driver included in a DRAM according to a fourth embodiment.
Figure 13:
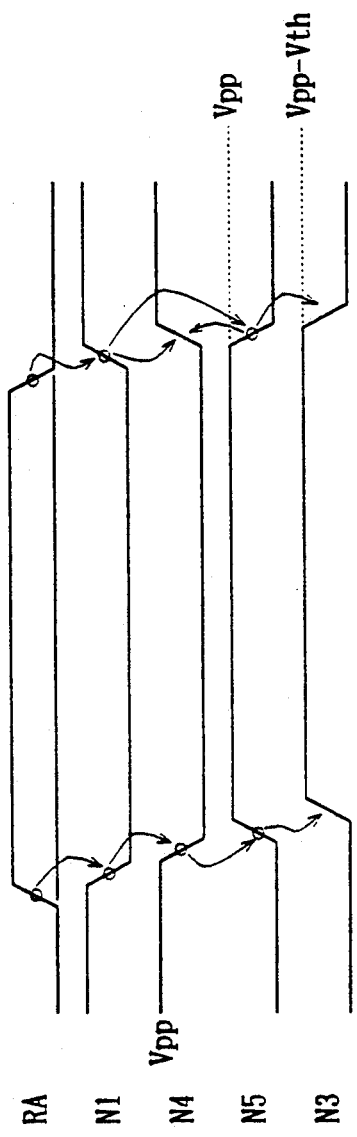
FIG. 13 is a timing chart for explaining operations of a driver circuit shown in FIG. 12.

(4) A fourth embodiment (FIGS. 12 and 13)

FIG. 12 is a diagram showing a detailed configuration of a row decoder and a word driver of a DRAM according to the fourth embodiment.

A word driver 7c includes a plurality of driver circuits 73 corresponding to the plurality of word lines WL. Each driver circuit 73 includes N channel transistors TR1, TR2, TR3, TR21 and a high voltage supplying circuit 77.

The transistor TR21 is connected between the node N1 and the node N4, and the gate thereof receives the power supply voltage Vcc. The transistor TR11, connected between the node NY and the node N4, has the gate connected to the node N5. The transistor TR12, connected between the node NY and the node N5, has the gate connected to the node N4. The transistor TR14, connected between the node N5 and the ground terminal, has the gate connected to the node N4. The node N5 is connected to the node N3 through the transfer transistor TR1. The gate of the transfer transistor TR3 is connected to the node N4. The high voltage Vpp is applied to the node NY from the Vpp generating circuit 24 shown in FIG. 9.

The other configuration except for the word driver 7c of the DRAM of the fourth embodiment is similar to that of the DRAM of the third embodiment shown in FIG. 9.

Operations of the driver circuit 73 of FIG. 12 will now be described with reference to a timing chart of FIG. 13.

When the potential of the node N1 is the power supply voltage Vcc, the transistor TR12 is in an off-state, and the transistor TR14 is in an on-state. As a result, the potential of the node N5 becomes the ground potential and the potential of the node N3 also becomes the ground potential. The transistor TR11 is turned on, and the node N4 is charged to the high voltage Vpp.

When the potential of the node N1 falls to the ground potential, the potential of the node N4 also falls to the ground potential, thereby causing the transistors TR12, TR14 to be turned and off, respectively. As a result, the node N5 is charged to the high voltage Vpp, and the potential of the node N3 becomes Vpp−Vth. The transistor TR11 is turned off.

When the potential of node N1 rises to the power supply voltage Vcc, the node N4 is charged to Vcc−Vth through the transistor TR21, where Vth is the threshold voltage of the transistor TR21. The transistor TR12 is turned off, and the transistor TR14 is turned on, thereby causing the node N5 to fall to the ground potential and the potential of the node N3 to also become the ground potential. The transistor TR11 is turned on, and the node N4 is charged to the high voltage Vpp.

In the driver circuit 72 of FIG. 10, when the potential of the node N1 rises to the power supply voltage Vc cat the time of non-selection (at the time of reset), the node N4 is charged only by the transistor TR11. Therefore, it takes a certain time for the node N4 to be charged to the high voltage Vpp. Thus, there is a possibility that a through out current flows to the ground terminal from the node NY through the transistors TR12, TR14.

Conversely, in the driver circuit 73 of FIG. 12, since the node N4 is charged to Vcc−Vth through the transistor TR21 by the decoder circuit 60 at the time of reset, the potential of the node N4 quickly reaches the high voltage Vpp. Therefore, it is possible to prevent the through out current from flowing through the transistors TR12, TR14.

Figure 14:
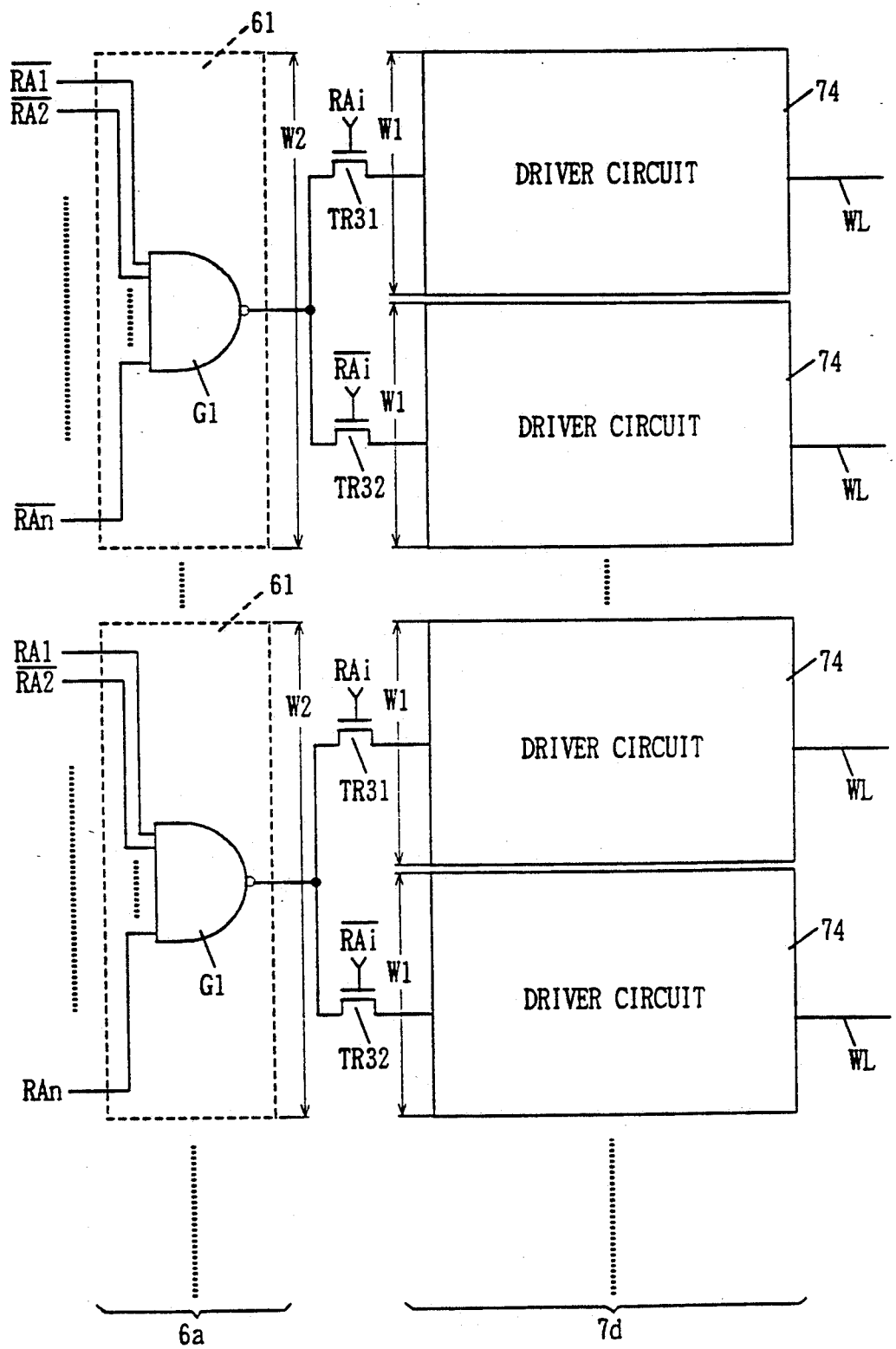
FIG. 14 is a diagram showing a configuration of a row decoder and a word driver included in a DRAM according to a fifth embodiment.

(5) A fifth embodiment (FIG. 14)

FIG. 14 is a diagram showing a detailed configuration of a row decoder and a word driver of a DRAM according to a fifth embodiment.

A row decoder 6a includes decoder circuits 61, the number of which is equal to a half of that of the word lines WL. A word driver 7d includes a plurality of driver circuits 74 corresponding to the plurality of word lines WL. Each decoder circuits 61 has its output terminal connected to two driver circuits 74 through the N channel transistors TR31, TR32. The transistors TR31, TR32 are referred to as switch transistors.

A 1-bit signal RAi of the row address signal RA and an inverted signal /RAi of the 1-bit signal are applied to the gate of the switch transistor TR31 and the gate of the switch transistor TR32, respectively. Therefore, signals excluding the signal RAi and the inverted signal /RAi are applied to each decoder circuit 61.

The configuration of each driver circuit 74 is equal to any of the configurations of the driver circuit 71 of FIG. 2, the driver circuit 72 of FIG. 10 and the driver circuit 73 of FIG. 12.

In the embodiment of FIG. 14, one decoder circuit 61 is provided in common to two driver circuits 74. Therefore, the decoder circuit 61 can be formed which has width W2 equal to a double of the width W1 of each driver circuit 74, thereby making it possible to form the decoder circuit 61 at pitches equal to a double of those of the driver circuit 74. As a result, even if the area occupied by the decoder circuit 61 becomes larger as increase of degree of integration, the entire layout can be carried out efficiently.

Figure 15:
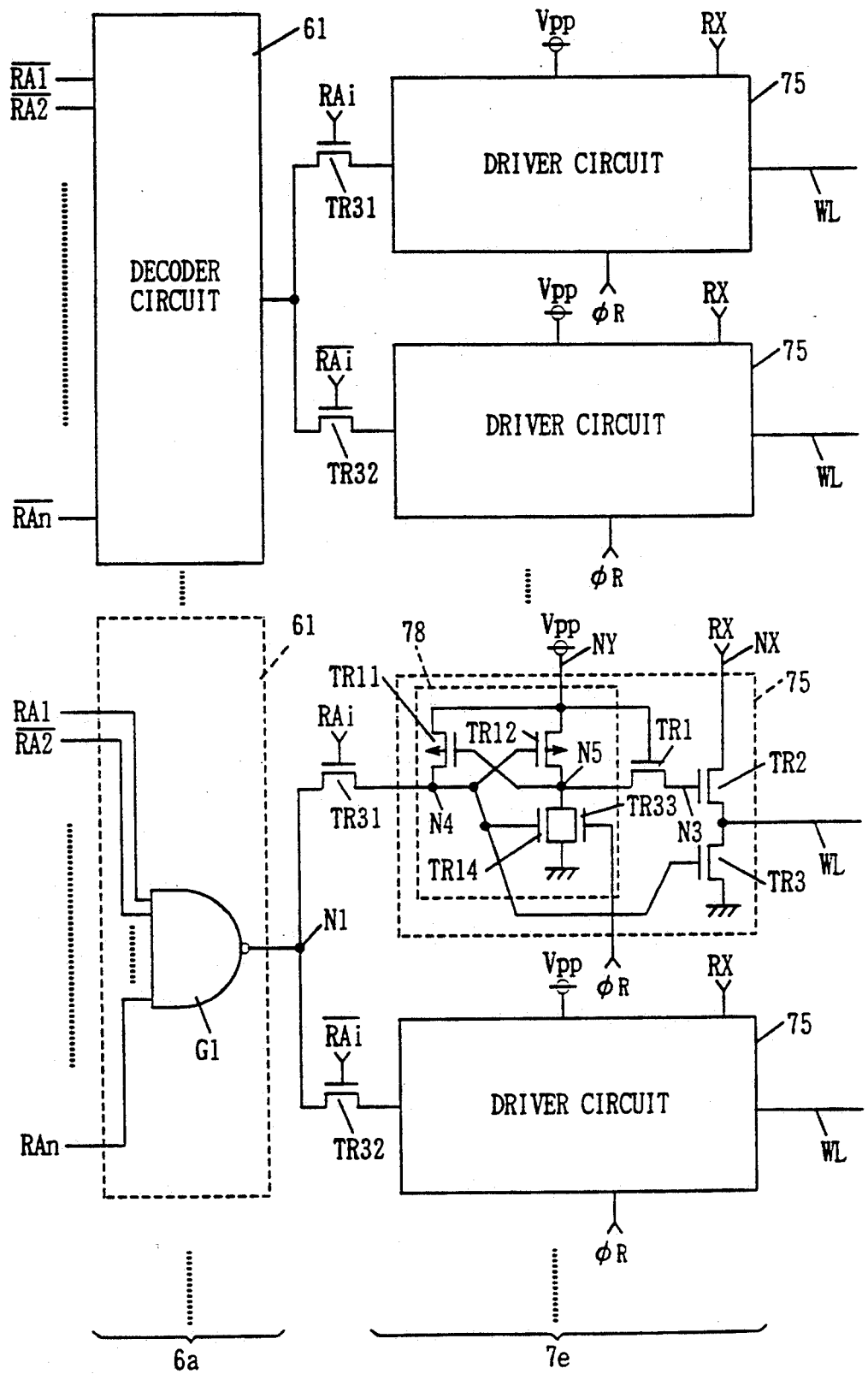
FIG. 15 is a schematic diagram of a circuit showing a configuration of a row decoder and a word driver included in a DRAM according to a sixth embodiment.
Figure 16:
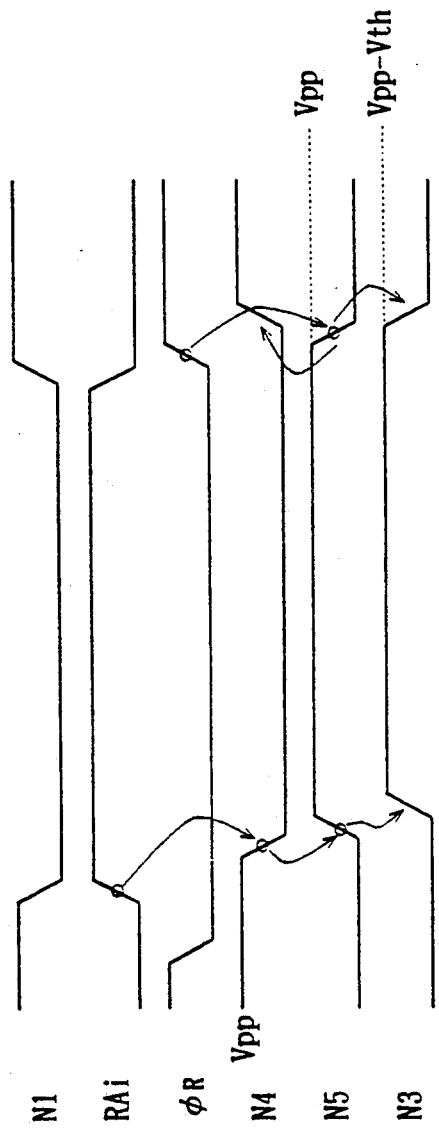
FIG. 16 is a timing chart for explaining operations of a driver circuit shown in FIG. 15.

(6) A sixth embodiment (FIGS. 15 and 16)

FIG. 15 is a diagram showing a detailed configuration of a low decoder and a word driver of a DRAM according to a sixth embodiment. The DRAM of FIG. 15 is different from that of FIG. 14 in that the configuration of a word driver 7e is different from that of the word driver 7d.

The word driver 7e includes a plurality of driver circuits 75 corresponding to the plurality of word lines WL. Each driver circuit 75 includes N channel transistors TR1, TR2, TR3 and a high voltage supplying circuit 78.

The high voltage supplying circuit 78 includes P channel transistors TR11, TR12 and N channel transistors TR14, TR33. The high voltage supplying circuit 78 is different from the high voltage supplying circuit 77 shown in FIG. 12 in that a transistor TR31 is further provided. The transistor TR33 is connected between the node N5 and the ground terminal, and the gate thereof receives a predetermined reset signal $\phi_R$.

Operations of the driver circuit 75 of FIG. 15 will now be described with reference to a timing chart of FIG. 16.

When the potential of the node N1 falls to the ground potential, and the signal RAi rises to "H", the potential of the node N4 falls to the ground potential, causing the transistor TR12 to be turned on, and the transistor TR14 to be turned off. As a result, the node N5 is charged to the high voltage Vpp and the potential of the node N3 becomes Vpp−Vth. The transistor TR11 is turned off.

When the potential of the node N1 rises to the power supply voltage Vcc, and the signal RAi falls to "L", the transistors TR12 and TR14 are turned off and on, respectively. At that time, when the reset signal $\phi_R$ rises to "H", the transistor TR33 is turned on. As a result, the node N5 is discharged to the ground potential, and the potential of the node N3 also becomes the ground potential. The transistor TR11 is turned on, and the node N4 is charged to the high voltage Vpp.

If rise of the potential of the node N1 and fall of the signal RAi cross each other, or if the timing at which the potential of the node N1 rises to the power supply voltage Vcc is later than the timing at which the signal RAi falls to "L", the potential level of the node N4 becomes unstable. As a result, there is a possibility that a through out current flowing through the transistors TR12, TR14 becomes larger.

In the above-described embodiment, however, it is possible to quickly charge the node N4 to the high voltage Vpp by forcing the transistor TR33 and the transistor TR11 to be turned on by the reset signal $\phi_R$ at the time of non-selection (at the time of reset). Therefore, the potential level of the node N4 becomes stable, resulting in a smaller through out current flowing through the transistors TR12, TR14.

As described above, according to the present invention, a rising rate of a voltage of a word line increases even when the power supply voltage is low. Therefore, a semiconductor memory device which can operate at a high speed can be obtained.

Even when the area occupied by selecting means becomes larger because of a higher degree of integration, it is possible to carry out a layout efficiently.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a word line;
   selecting means for generating a selecting signal for selecting said word line;
   driving means for driving said word line in response to said selecting signal;
   said driving means including
      a transfer transistor having a gate receiving a power supply voltage and for transmitting a voltage responding to said selecting signal, and
      a driver transistor having a gate receiving a voltage transmitted by said transfer transistor and for charging said word line to a predetermined voltage, and
   boosting means for boosting a voltage to be applied to the gate of said transfer transistor to a voltage of said power supply voltage plus a predetermined voltage lower than a threshold voltage of said transfer transistor.

2. The semiconductor memory device according to claim 1, wherein
   said driving means further comprises
   a first node receiving a driving signal having a voltage higher than the power supply voltage,
   a second node receiving said voltage responding to said selecting signals, and
   discharging means responsive to said selecting signal for discharging said word line,
   said driver transistor is connected between said first node and said word line, and
   said transfer transistor is connected between said second node and the gate of said driver transistor.

3. The semiconductor memory device according to claim 1, further comprising clamping means for clamping said boosted voltage to a constant voltage.

4. The semiconductor memory device according to claim 1, further comprising receiving means receiving a control signal for defining an active period wherein said boosting means boosts a voltage to be applied to the gate of said transfer transistor in response to said control signal.

5. A semiconductor memory device, comprising:
   a word line;
   selecting means for generating a selecting signal for selecting said word line;
   driving means for driving said word line in response to said selecting signal,
   said driving means including;
      a transfer transistor having a gate receiving a power supply voltage and for transmitting a voltage responding to said selecting signal, and
      a driver transistor having a gate receiving a voltage transmitted by said transfer transistor and for charging said word line to a predetermined voltage, and
   voltage control means responsive to initiation of an active period for boosting a voltage to be applied to the gate of said transfer transistor to a voltage of said power supply voltage plus a threshold voltage of said transfer transistor, and responsive to drive of said word line for pulling down said boosted voltage to said power supply voltage.

6. The semiconductor memory device according to claim 5, wherein
   said driving means further comprises
   a first node receiving a driving signal having a voltage higher than a power supply voltage,
   a second node receiving said voltage responding to said selecting signal, and
   discharging means responsive to said selecting signal for discharging said word line,
   said driver transistor is connected between said first node and said word line, and said transfer transistor is connected between said second node and the gate of said driver transistor.

7. The semiconductor memory device according to claim 5, further comprising clamping means for clamping said boosted voltage to a constant voltage.

8. The semiconductor memory device according to claim 5, further comprising receiving means receiving a control signal for defining an active period, wherein said voltage control means boosts a voltage to be applied to gate of said transfer transistor in response to said control signal, and pulls down said boosted voltage to said power supply voltage in response to a delay signal of said control signal.

9. A semiconductor memory device, comprising:
   a word line;
   selecting means for generating a selecting signal for selecting said word line;
   driving means responsive to said selecting signal for driving said word line; and
   high voltage generating means for generating a predetermined high voltage higher than a power supply voltage,
   said driving means including
      high voltage supplying means responsive to said selecting signal for supplying said high voltage,
      a transfer transistor having a gate receiving said high voltage from said high voltage generating means and for transmitting a voltage from said high voltage supplying means, and a driver transistor having a gate receiving a voltage transmitted by said transfer transistor and for charging said word line to a predetermined voltage.

10. The semiconductor memory device according to claim 9, wherein said high voltage supplying means comprise a first node receiving a voltage responding to said selecting signal, a second node connected to said transfer transistor, first charging means responsive to a voltage of said second node for charging said first node to said high voltage at the time of non-selection, and second charging means responsive to a voltage of said first node for charging said second node to said high voltage at the time of selection.

11. The semiconductor memory device according to claim 10, wherein said high voltage supplying means further comprises first discharging means for discharging said first node at the time of selection, and second discharging means for discharging said second node at the time of non-selection.

12. The semiconductor memory device according to claim 10, wherein said driving means further comprises a transfer transistor having a gate receiving said power supply voltage and connected between an output of said selecting means and said first node.

13. The semiconductor memory device according to claim 12, wherein said high voltage supplying means further comprises discharging means for discharging said second node at the time of non-selection.

14. The semiconductor memory device according to claim 11, wherein said driving means further comprises a third node receiving a driving signal having a voltage higher than a power supply voltage, and third discharging means responsive to said selecting signal for discharging said word line, said driver transistor is connected between said third node and said word line, and said transfer transistor is connected between said second node and the gate of said driver transistor.

15. The semiconductor memory device according to claim 13, wherein said driving means further comprises a third node receiving a driving signal having a voltage higher than said power supply voltage, and second discharging means responsive to said selecting signal for discharging said word line, said driver transistor is connected between said third node and said word line, and said transfer transistor is connected between said second node and the gate of said driver transistor.

16. A semiconductor memory device, comprising:

a plurality of word lines;

a plurality of driving means provided corresponding to said plurality of word lines;

selecting means provided in common to said plurality of driving means for generating a selecting signal; and switching means connected between said selecting means and said plurality of driving means for selectively transmitting the selecting signal from said selecting means to any of said plurality of driving means, each of said plurality of driving means including a transfer transistor for transmitting a voltage responding to said selecting signal, a driver transistor having a gate receiving a voltage transmitted by said transfer transistor and for charging a corresponding word line to a predetermined voltage, and voltage supplying means for supplying a predetermined voltage higher than a power supply voltage to the gate of said transfer transistor.

17. The semiconductor memory device according to claim 16, further comprising high voltage generating means for generating a predetermined high voltage higher than said power supply voltage;

wherein said switching means includes a plurality of switch transistors respectively connected between said selecting means and said plurality of driving means;

each of said plurality of driving means further includes:

high voltage supplying means responsive to said selecting signal for supplying said high voltage to said transfer transistor as said voltage responding to said selecting signal;

said high voltage supplying means includes a first node connected to a corresponding switch transistor, a second node connected to said transfer transistor, first charging means responsive to a voltage of said second node for charging said first node to said high voltage at the time of non-selection, second charging means responsive to a voltage of said first node for charging said second node to said high voltage at the time of selection, and first discharging means responsive to a predetermined reset signal for discharging said second node at the time of non-selection.

18. The semiconductor memory device according to claim 17, wherein said high voltage supplying means further comprises second discharging means responsive to a voltage of said first node for discharging said second node.

19. The semiconductor memory device according to claim 17, wherein said driving means further comprises a third node receiving a driving signal having a voltage higher than a power supply voltage, and second discharging means responsive to said selecting signal for discharging said word line, said driver transistor is connected between said third node and said corresponding word line, and said transfer transistor is connected between said second node and the gate of said driver transistor.

20. The semiconductor memory device according to claim 18, wherein each of said driving means further comprises a third node receiving a driving signal having a voltage higher than a power supply voltage, and third discharging means responsive to said selecting signal for discharging a corresponding word line, said driver transistor is connected between said third node and said word line, and said transfer transistor is connected between said second node and the gate of said driver transistor.

21. A method of operating a semiconductor memory device comprising a word driver including a transfer transistor for transmitting a voltage responding to a selecting signal, and a driver transistor having a gate receiving a voltage transmitted by the transfer transistor and for charging a word line to a predetermined voltage, the method comprising the step of
  boosting a voltage to be applied to the gate of said transfer transistor to a voltage of a power supply voltage plus a predetermined voltage lower than a threshold voltage of said transfer transistor in an active period.

22. A method of operating a semiconductor memory device comprising a word driver including a transfer transistor for transmitting a voltage responding to a selecting signal, and a driver transistor having a gate receiving a voltage transmitted by the transfer transistor and for charging a word line to a predetermined voltage, the method comprising the steps of:
  boosting a voltage to be applied to the gate of said transfer transistor to a voltage of a power supply voltage plus a threshold voltage of said transfer transistor in response to initiation of an active period; and
  pulling down said boosted voltage to said power supply voltage in response to charge of said word line.

23. A method of operating a semiconductor memory device comprising a word driver including a transfer transistor for transmitting a voltage responding to a selecting signal, and a driver transistor having a gate receiving a voltage transmitted by the transfer transistor and for charging a word line to a predetermined voltage, the method comprising the steps of:
  generating a predetermined high voltage higher than a power supply voltage;
  applying said high voltage to the gate of said transfer transistor; and
  supplying said high voltage to said transfer transistor as said voltage responding to a selecting signal at the time of selection.

24. A method of operating a semiconductor memory device comprising a plurality of word lines, a plurality of word drivers provided corresponding to said plurality of word lines, and a decoder provided in common to said plurality of word drivers for generating a selecting signal, each of said plurality of word drivers including a transfer transistor for transmitting a voltage responding to said selecting signal, and a driver transistor having a gate receiving a voltage transmitted by said transfer transistor and for charging a corresponding word line to a predetermined voltage, the method comprising the steps of:
  transmitting selectively said selecting signal from said decoder to any of said plurality of word drivers; and
  supplying a predetermined voltage higher than a power supply voltage to the gate of said transfer transistor included in each of said plurality of word drivers.

* * * * *